(12) United States Patent
Blomberg et al.

(10) Patent No.: US 12,354,872 B2
(45) Date of Patent: Jul. 8, 2025

(54) METHOD FOR FORMING DOPED METAL OXIDE FILMS ON A SUBSTRATE BY CYCLICAL DEPOSITION AND RELATED SEMICONDUCTOR DEVICE STRUCTURES

(71) Applicant: ASM IP Holding B.V., Almere (NL)

(72) Inventors: Tom Blomberg, Vantaa (FI); Chiyu Zhu, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/140,926

(22) Filed: Apr. 28, 2023

(65) Prior Publication Data

US 2023/0260784 A1    Aug. 17, 2023

Related U.S. Application Data

(60) Division of application No. 16/713,311, filed on Dec. 13, 2019, now Pat. No. 11,658,030, which is a
(Continued)

(51) Int. Cl.
*H01L 21/02* (2006.01)
*C23C 16/40* (2006.01)
(Continued)

(52) U.S. Cl.
CPC ...... *H01L 21/02565* (2013.01); *C23C 16/401* (2013.01); *C23C 16/407* (2013.01);
(Continued)

(58) Field of Classification Search
CPC .......... H01L 21/02565; H01L 21/0228; H01L 21/0257; H01L 21/0262; H01L 21/28194;
(Continued)

(56) References Cited

U.S. PATENT DOCUMENTS 6,452,017 B1    9/2002  Uhlenbrock et al.
6,984,591 B1 *  1/2006  Buchanan ............... C23C 16/16
                                                257/E21.174
(Continued)

FOREIGN PATENT DOCUMENTS

KR    20020064126 A    8/2002
KR    20100028347 A    3/2010

OTHER PUBLICATIONS

USPTO; Notice of Allowance dated Jan. 27, 2023 in U.S. Appl. No. 16/713,311.
(Continued)

*Primary Examiner* — Galina G Yushina
(74) *Attorney, Agent, or Firm* — Snell & Wilmer L.L.P.

(57) ABSTRACT

Methods for forming a doped metal oxide film on a substrate by cyclical deposition are provided. In some embodiments, methods may include contacting the substrate with a first reactant comprising a metal halide source, contacting the substrate with a second reactant comprising a hydrogenated source and contacting the substrate with a third reactant comprising an oxide source. In some embodiments, related semiconductor device structures may include a doped metal oxide film formed by cyclical deposition processes.

19 Claims, 5 Drawing Sheets

Related U.S. Application Data continuation of application No. 15/917,262, filed on Mar. 9, 2018, now Pat. No. 10,529,563.

(60) Provisional application No. 62/478,471, filed on Mar. 29, 2017.

(51) Int. Cl.
  *C23C 16/455* (2006.01)
  *H01L 21/28* (2025.01)

(52) U.S. Cl.
  CPC .. *C23C 16/45523* (2013.01); *C23C 16/45527* (2013.01); *H01L 21/0228* (2013.01); *H01L 21/0257* (2013.01); *H01L 21/0262* (2013.01); *H01L 21/28194* (2013.01); *H01L 21/02592* (2013.01)

(58) Field of Classification Search
  CPC ......... H01L 21/02592; H01L 31/02167; H01L 21/02172; C23C 16/401; C23C 16/407; C23C 16/45527; C23C 16/405; C23C 16/042
  See application file for complete search history.

(56) References Cited

U.S. PATENT DOCUMENTS

| | | | |
|---|---|---|---|
| 8,546,275 B2 | 10/2013 | Wang et al. | |
| 8,698,221 B2 | 4/2014 | Park et al. | |
| 8,803,142 B2 | 8/2014 | Yamazaki et al. | |
| 10,529,563 B2* | 1/2020 | Blomberg | H01L 21/02565 |
| 11,658,030 B2* | 5/2023 | Blomberg | H01L 21/0262 257/43 |
| 2003/0040196 A1 | 2/2003 | Lim et al. | |
| 2005/0153571 A1* | 7/2005 | Senzaki | C23C 16/029 438/785 |
| 2006/0166476 A1* | 7/2006 | Lee | H10B 12/033 438/785 |
| 2006/0211259 A1* | 9/2006 | Maes | C23C 16/45504 257/E29.151 |
| 2006/0257563 A1* | 11/2006 | Doh | C23C 16/45531 427/248.1 |
| 2007/0048953 A1 | 3/2007 | Gealy et al. | |
| 2012/0066956 A1* | 3/2012 | Lyngstadaas | A01K 85/00 427/248.1 |
| 2012/0126300 A1* | 5/2012 | Park | H01G 4/20 257/296 |
| 2012/0202358 A1* | 8/2012 | Gealy | H01L 28/40 438/785 |
| 2013/0078392 A1 | 3/2013 | Xiao et al. | |
| 2013/0122678 A1* | 5/2013 | Malhotra | H01L 21/0228 438/381 |
| 2013/0280891 A1 | 10/2013 | Kim et al. | |
| 2016/0155635 A1* | 6/2016 | Matero | H01L 21/02304 438/778 |

OTHER PUBLICATIONS

USPTO; Non-Final Office Action dated Oct. 6, 2022 in U.S. Appl. No. 16/713,311.
USPTO; Decision on Appeal dated Jul. 14, 2022 in U.S. Appl. No. 16/713,311.
USPTO; Final Office Action dated Feb. 22, 2021 in U.S. Appl. No. 16/713,311.
USPTO; Examiner's Answer to Appeal Brief dated Aug. 2, 2021 in U.S. Appl. No. 16/713,311.

* cited by examiner

METHOD FOR FORMING DOPED METAL OXIDE FILMS ON A SUBSTRATE BY CYCLICAL DEPOSITION AND RELATED SEMICONDUCTOR DEVICE STRUCTURES

CROSS-REFERENCE TO RELATED APPLICATION

This application is a divisional of, and claims priority to, U.S. patent application Ser. No. 16/713,311 filed Dec. 13, 2019 titled METHOD FOR FORMING DOPED METAL OXIDE FILMS ON A SUBSTRATE BY CYCLICAL DEPOSITION AND RELATED SEMICONDUCTOR DEVICE STRUCTURES; which is a continuation of, and claims priority to, U.S. patent application Ser. No. 15/917,262, filed Mar. 9, 2018 and titled METHOD FOR FORMING DOPED METAL OXIDE FILMS ON A SUBSTRATE BY CYCLICAL DEPOSITION AND RELATED SEMICONDUCTOR DEVICE STRUCTURES; which claims priority to and the benefit of U.S. Provisional Patent Application No. 62/478,471, filed Mar. 29, 2017 and titled METHOD FOR FORMING DOPED METAL OXIDE FILMS ON A SUBSTRATE BY CYCLICAL DEPOSITION AND RELATED SEMICONDUCTOR DEVICE STRUCTURES, the disclosures of which are hereby incorporated by reference in their entirety.

BACKGROUND

Field of the Invention

The present disclosure relates generally to methods for forming doped metal oxide films on a substrate by cyclical deposition and particular for forming metal oxide films doped with at least one of silicon or germanium. The disclosure also relates to semiconductor device structures including a doped metal oxide film formed by cyclical deposition.

Description of the Related Art

Metal oxide films, such as titanium oxide, zirconium oxide and hafnium oxide films may be utilized in the fabrication of semiconductor device structures. For example, titanium oxide films may be used as photocatalyst films for fuel cell applications. In addition, titanium oxide films may be utilized as charge collecting electrodes in dye sensitize and perovskite solar cell structures and applications.

The electrical and optical properties of metal oxide films, such as titanium oxide films, can depend on the crystal structure of the film as well as on the doping level within the metal oxide film. Doping of metal oxide films may be achieved with a number of elements, such as, for example niobium and tungsten, and the nature of the doping element and the doping level may be selected to tailor the properties of the metal oxide film to a specific application. For example, titanium oxide films may be utilized as transparent conducting oxides in optoelectronic applications but the intrinsic electrical conductivity of titanium oxide is substantially lower than other traditional transparent conductive oxides and therefore may require doping with specific elements to significantly improve the electrical characteristics of such titanium oxide films.

Methods and semiconductor device structures are therefore desirable that are able to form doped metal oxide films and particularly doped metal oxide films with a selected crystal structure and doping characteristics.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for forming a doped metal oxide film on a substrate by cyclical deposition are provided. The method may comprise contacting the substrate with a first reactant comprising a metal halide source, contacting the substrate with a second reactant comprising a hydrogenated source and contacting the substrate with a third reactant comprising an oxide source.

For purposes of summarizing the invention and the advantages achieved over the prior art, certain objects and advantages of the invention have been described herein above. Of course, it is to be understood that not necessarily all such objects or advantages may be achieved in accordance with any particular embodiments of the invention. Thus, for example, those skilled in the art will recognize that the invention may be embodied or carried out in a manner that achieves or optimizes one advantage, or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

DETAILED DESCRIPTION

Figure 1:
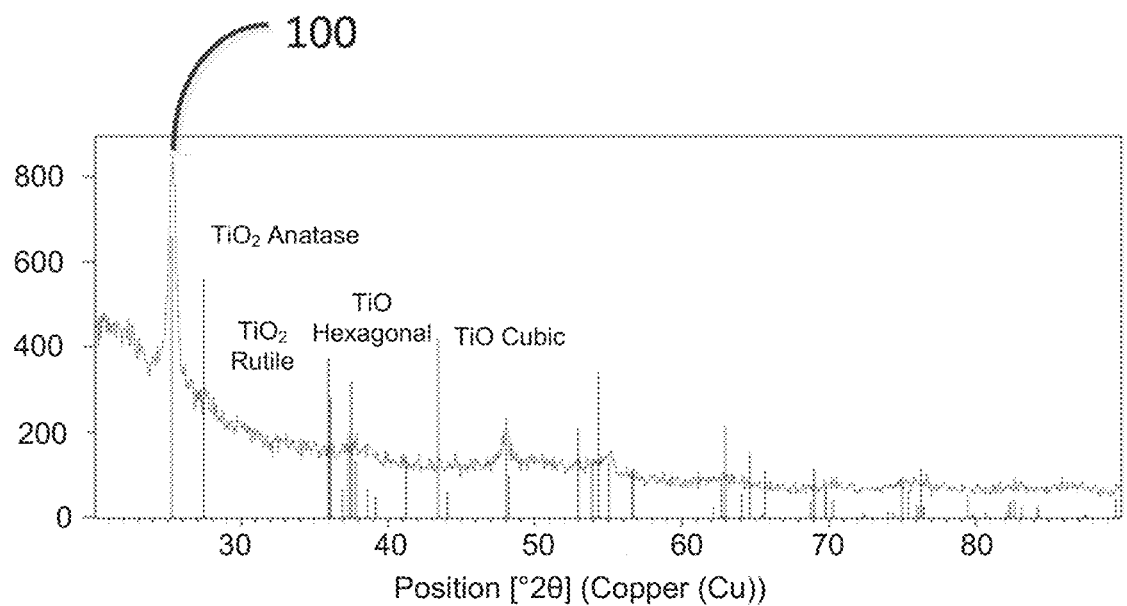
FIG. 1 is a graph showing a x-ray diffraction (XRD) scan of a silicon doped titanium oxide film formed according to the embodiments of the disclosure.

The illustrations presented herein are not meant to be actual views of any particular material, structure, or device, but are merely idealized representations that are used to describe embodiments of the disclosure.

As used herein, the term "cyclic deposition" may refer to the sequential introduction of precursors (reactants) into a reaction chamber to deposit a layer over a substrate and includes processing techniques such as atomic layer deposition and cyclical chemical vapor deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "cyclical chemical vapor deposition" may refer to any process wherein a substrate is sequentially exposed to two or more volatile precursors, which react and/or decompose on a substrate to produce a desired deposition.

As used herein, the term "substrate" may refer to any underlying material or materials that may be used, or upon which a device, a circuit or a film may be formed. Substrate may comprise a wafer, such as silicon wafer, glass substrate or any other type of substrate.

A number of example materials are given throughout the embodiments of the current disclosure, it should be noted that the chemical formulas give for each of the example materials should not be construed as limiting and that the non-limiting example materials given should not be limited by a given example stoichiometry.

The present disclosure includes methods for forming a doped metal oxide film on a substrate by a cyclical deposition process and the semiconductor device structures themselves that include a doped metal oxide film formed by the cyclical deposition process. The methods of the disclosure may particularly include methods for cyclical deposition of silicon and/or germanium doped metal oxide films comprising at least one of titanium oxide, zirconium oxide or hafnium oxide. The disclosure may also include utilizing a doped metal oxide film as a component of a semiconductor device structure. The disclosure may also include methods for forming a doped metal oxide film with desirable electrical conductivity and desirable crystallographic properties. Examples of such methods and semiconductor devices structures are disclosed in further detail below.

A non-limiting example embodiment of a cyclical deposition process may include ALD, wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an adsorbed layer of one reactant leaves a surface termination that is non-reactive with the gas phase reactants of the same reactant. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example if some gas phase reactions occur despite the alternating nature of the process.

In an ALD-type process for depositing a doped metal oxide film, one deposition cycle may comprise exposing the substrate to a first reactant, removing any unreacted first reactant and reaction byproducts from the reaction space, exposing the substrate to a second reactant, followed by a second removal step and exposing the substrate to a third reactant, followed by a third removal step. The first reactant may comprise a metal halide source, the second reactant may comprise a hydrogenated source, and the third reactant may comprise an oxide source.

Precursors may be separated by inert gases, such as argon (Ar) or nitrogen ($N_2$), to prevent gas-phase reactions between reactants and enable self-saturating surface reactions. In some embodiments, however, the substrate may be moved to separately contact a first vapor phase reactant, a second vapor phase reactant and a third vapor phase reactant. Because the reactions self-saturate, strict temperature control of the substrates and precise dosage control of the precursors is not usually required. However, the substrate temperature is preferably such that an incident gas species does not condense into monolayers or multimonolayers nor thermally decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

Reactors capable of being used to grow thin films can be used for the deposition. Such reactors include ALD reactors, as well as CVD reactors equipped with appropriate equipment and means for providing the precursors. According to some embodiments, a showerhead reactor may be used.

Examples of suitable reactors that may be used include commercially available single substrate (or single wafer) deposition equipment such as Pulsar® reactors (such as the Pulsar® 2000 and the Pulsar® 3000 and Pulsar® XP ALD), and EmerALD® XP and the EmerALD® reactors, available from ASM America, Inc. of Phoenix, Arizona and ASM Europe B.V., Almere, Netherlands. Other commercially available reactors include those from ASM Japan K.K.

(Tokyo, Japan) under the tradename Eagle® XP and XP8. In some embodiments, the reactor is a spatial ALD reactor, in which the substrates moves or rotates during processing.

In some embodiments, a batch reactor may be used. Suitable batch reactors include, but are not limited to, Advance® 400 Series reactors commercially available from ASM Europe B.V (Almere, Netherlands) under the trade names A400 and A412 PLUS. In some embodiments, a vertical batch reactor is utilized in which the boat rotates during processing. Thus, In some embodiments, the wafers rotate during processing. In other embodiments, the batch reactor comprises a minibatch reactor configured to accommodate 10 or fewer wafers, 8 or fewer wafers, 6 or fewer wafers, 4 or fewer wafers, or 2 wafers. In some embodiments in which a batch reactor is used, wafer-to-wafer non-uniformity is less than 3% (1 sigma), less than 2%, less than 1% or even less than 0.5%.

The deposition processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run. Additionally, in a cluster tool it is possible to reduce the time to pump the reaction space to the desired process pressure levels between substrates.

A stand-alone reactor can be equipped with a load-lock. In that case, it is not necessary to cool down the reaction space between each run. In some embodiments, a deposition process for depositing a thin film comprising a doped metal oxide film may comprise a plurality of deposition cycles, for example ALD cycles.

In some embodiments, the cyclical deposition processes are used to form doped metal oxide films on a substrate and the cyclical deposition process may be an ALD type process. In some embodiments, the cyclical deposition may be a hybrid ALD/CVD or cyclical CVD process. For example, In some embodiments, the growth rate of the ALD process may be low compared with a CVD process. One approach to increase the growth rate may be that of operating at a higher substrate temperature than that typically employed in an ALD process, resulting in a chemical vapor deposition process, but still taking advantage of the sequential introduction of precursors, such a process may be referred to as cyclical CVD.

According to some embodiments, ALD processes are used to form doped metal oxide films on a substrate, such as an integrated circuit workpiece. In some embodiments of the disclosure each ALD cycle comprises three distinct deposition steps or phases.

In a first phase of the deposition cycle ("the metal phase"), the substrate surface on which deposition is desired is contacted with a first vapor phase reactant comprising a metal precursor which chemisorbs onto the substrate surface, forming no more than about one monolayer of reactant species on the surface of the substrate.

In addition, it should be appreciated that in some embodiments, each contacting step may be repeated one or more times prior to advancing on to the subsequent processing step, i.e., prior to a subsequent contacting step or removal/purge step.

In some embodiments, a metal precursor, also referred to herein as the "metal compound" may comprise a metal halide source. In some embodiments, the first reactant may comprise a metal halide source, in particular a transition metal halide source. The transition metal halide source or compound may comprise at least one of the transition metals selected from the group comprising, scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg).

As a non-limiting example embodiment, a metal halide source, such as, e.g., titanium tetrachloride ($TiCl_4$), may be used as the metal halide source in a cyclical deposition processes, such as an ALD process. In some other embodiments, when the film is a doped zirconium oxide film or a doped hafnium oxide film, metal halides such as zirconium tetrachloride ($ZrCl_4$) or hafnium tetrachloride ($HfCl_4$) may be used. In other embodiments metal sources comprising metal-organic compounds of titanium can be used. In other embodiments, metal sources comprising metal-organic compounds of zirconium and hafnium may be utilized. In some embodiments, one or more metal chloride sources are used. In some embodiments, a liquid metal compound is used (liquid at approximately room temperature or at approximately 20° C.).

In some embodiments, exposing the substrate to a metal halide source may comprise pulsing the metal precursor (e.g., the titanium tetrachloride) over the substrate for a time period of between about 0.01 seconds and about 60 seconds, between about 0.05 seconds and about 10.0 seconds, between about 0.1 seconds and about 5.0 seconds. In addition, during the pulsing of the metal halide source over the substrate the flow rate of the metal halide source may be less than 2000 sccm, or less than 1000 sccm, or less than 500 sccm, or less than 250 sccm, or even less than 150 sccm.

Excess metal halide source and reaction byproducts (if any) may be removed from the substrate surface, e.g., by purging with an inert gas. For example, in some embodiments of the disclosure the methods may include a purge cycle wherein the substrate surface is purged for a time period of less than approximately 5.0 seconds. Excess metal halide source and any reaction byproducts may be removed with the aid of a vacuum generated by a pumping system.

In a second phase of the deposition cycle ("the hydrogenated phase"), the substrate is contacted with a second vapor phase reactant comprising a hydrogenated source. In some embodiments of the disclosure, methods may further comprise selecting the hydrogenated source to comprise a hydrogenated silicon source and the hydrogenated silicon source may further comprise at least one of silane ($SiH_4$), disilane ($Si_2H_6$), trisilane ($Si_3H_8$) or tetrasilane ($Si_4H_{10}$). In addition, the hydrogenated silicon source may comprise higher order silanes with the general empirical formula $Si_xH_{(2x+2)}$. In some embodiments, the hydrogenated silicon source may be a cyclic silane. In some embodiments, the hydrogenated source comprises silanes without having any halides or hydrocarbons or any other ligands than hydrogen. In some embodiments of the disclosure, methods may further comprise selecting the hydrogenated source to comprise a hydrogenated germanium source and the hydrogenated germanium source may further comprise at least one of germane ($GeH_4$), digermane ($Ge_2H_6$), trigermane ($Ge_3H_8$), or tetragermane ($Ge_4H_{10}$). In addition, the hydrogenated germanium source may comprise higher germanes with the general empirical formula $Ge_xH_{(2x+2)}$. In some embodiments, the hydrogenated germanium source may be a cyclic germane. In some embodiments, the hydrogenated germanium source comprises germanium without having any halides or hydrocarbons or any other ligands than hydrogen.

In some embodiments, exposing the substrate to the hydrogenated source may comprise pulsing the hydrogenated source (e.g., disilane or digermane) over the substrate for a time period of between 0.1 seconds and 2.0 seconds or from about 0.01 seconds to about 10 seconds or less than about 20 seconds, less than about 10 seconds or less than about 5 seconds. During the pulsing of the hydrogenated source over the substrate the flow rate of the hydrogenated source may be less than 2000 sccm, or less than 1000 sccm, or less than 500 sccm, or even less than 100 sccm.

The second vapor phase reactant comprising a hydrogenated source may react with metal-containing molecules left on the substrate surface. In some embodiments, the second phase hydrogenated source may comprise a reducing agent capable of reducing the metal-containing molecules left on the substrate surface to thereby form a metallic film comprising a silicon or germanium component. For example, the first vapor phase reactant may comprise a titanium precursor and the second vapor phase reactant may comprise a reducing agent. After the titanium precursor is introduced into the reaction chamber and adsorb onto a substrate surface, the excess titanium precursor vapor may be pumped or purged from the chamber. This process is followed by the introduction of a reducing agent that reacts with the titanium precursor on the substrate surface to form a titanium metal comprising a silicon component or a germanium component and a free form of the ligand. This deposition cycle can be repeated if needed to achieve the desired thickness of the metallic film.

Excess second source chemical and reaction byproducts, if any, may be removed from the substrate surface, for example by a purging gas pulse and/or vacuum generated by a pumping system. Purging gas is preferably any inert gas, such as, without limitation, argon (Ar), nitrogen ($N_2$) or helium (He). A phase is generally considered to immediately follow another phase if a purge (i.e., purging gas pulse) or other reactant removal step intervenes.

In a third phase of the deposition cycle ("the oxide phase"), the substrate is contacted with a third vapor phase reactant comprising an oxide source. In some embodiments of the disclosure, methods may further comprise selecting the oxide source to comprise at least one of ozone ($O_3$), an oxygen (O) radical, atomic oxygen (O), molecular oxygen ($O_2$), an oxygen plasma, water ($H_2O$), or hydrogen peroxide ($H_2O_2$). In certain embodiments of the disclosure the oxidizer source may comprise water vapor ($H_2O$).

In some embodiments, exposing the substrate to the oxide source may comprise pulsing the oxide source (e.g., water vapor) over the substrate for a time period of between 0.1 seconds and 2.0 seconds or from about 0.01 seconds to about 10 seconds or less than about 20 seconds, less than about 10 seconds or less than about 5 seconds. During the pulsing of the oxidizer source over the substrate the flow rate of the oxidizer source may be less than 5000 sccm, or less than 2000 sccm, or less than 1000 sccm, or even less than 500 sccm.

The third vapor phase reactant comprising a oxide source may react with a film left on the substrate surface. Not to be bound by a specific theory, in some embodiments, the third phase oxide source may comprise an oxidizing agent capable of oxidizing the film left on the substrate surface to thereby form a doped metal oxide film. In some embodiments, alternative reactions may be responsible for the formation of the doped metal oxide film.

Excess third source chemical and reaction byproducts, if any, may be removed from the substrate surface, for example by a purging gas pulse and/or vacuum generated by a pumping system. Purging gas is preferably any inert gas, such as, without limitation, argon (Ar), nitrogen ($N_2$) or helium (He). A phase is generally considered to immediately follow another phase if a purge (i.e., purging gas pulse) or other reactant removal step intervenes.

In some embodiments of the disclosure a deposition cycle may comprise alternatively and sequentially contacting the substrate with the first reactant, followed by the second reactant, and subsequently followed by the third reactant. The deposition cycle in which the substrate is alternatively contacted with the first vapor phase reactant (i.e., the metal halide source), the second vapor phase reactant (i.e., the hydrogenated source) and the third vapor phase reactant (i.e., the oxide source) may be repeated two or more times until a desired thickness of a doped metal oxide film is deposited.

In embodiments wherein the doped metal oxide film is formed by alternative contacting the substrate with the first reactant, followed by the second reactant and subsequently by the third reactant, the doped metal oxide film may be an electrical conductor. In such embodiments the electrically conducting doped metal oxide film may have an electrical resistivity of less than approximately 200 mΩ-cm, or less than approximately 100 mΩ-cm, or even less than approximately 50 mΩ-cm. In some embodiments, the doped metal oxide film has electrical resistivity more than approximately 5 mΩ-cm, or more than approximately 10 mΩ-cm, or more than approximately 20 mΩ-cm, or more than approximately 50 mΩ-cm, or even more than approximately 100 mΩ-cm. In such embodiments the electrically conducting doped metal oxide film may have an electrical resistivity of less than approximately 100 mΩ-cm at a film thickness of less than approximately 1000 nm, or less than approximately 500 nm or less than approximately 100 nm, or even less than approximately 10 nm.

In embodiments wherein the doped metal oxide film is formed by alternative contacting the substrate with the first reactant, followed by the second reactant and subsequently by the third reactant the doped metal oxide film may have a substantially crystalline structure. As a non-limiting example embodiment FIG. 1 illustrates a graph showing the 2 theta x-ray diffraction (XRD) scan of an example doped metal oxide film formed by ALD process of the current disclosure utilizing a first reactant, followed by a second reactant and a subsequent third reactant For example, the XRD scan illustrated in FIG. 1 is taken from a silicon doped titanium oxide film formed by ALD utilizing titanium tetrachloride as a first reactant, followed by disilane as a second reactant and subsequently followed by water vapor as a third reactant at a substrate temperature of 350° C. The XRD scan illustrated in FIG. 1 indicates that the example silicon doped titanium oxide film formed by the methods of the disclosure is substantially crystalline, as indicated by the XRD peak labelled 100. As a non-limiting example, the silicon doped titanium oxide film illustrated in FIG. 1 has an anatase structure as denoted by the XRD peak labelled 100.

In embodiments wherein the doped metal oxide film is formed by alternative contacting the substrate with the first reactant, followed by the second reactant and subsequently by the third reactant, the doped metal oxide film may comprise at least one of silicon doped titanium oxide ($Ti_{1-x}Si_xO_2$), germanium doped titanium oxide ($Ti_{1-x}Ge_xO_2$), silicon doped zirconium oxide ($Zr_{1-x}Si_xO_2$), germanium doped zirconium oxide ($Zr_{1-x}Ge_xO_2$), silicon doped hafnium oxide ($Hf_{1-x}Si_xO_2$) or germanium doped hafnium oxide ($Hf_{1-x}Ge_xO_2$), where x is 0≤x≤1. In some embodiments of the disclosure the doped metal oxide film, may have a general formula given by $M_{1-x}D_xO_2$ where M is the metal, D is the dopant and wherein x is less than approximately 0.25, or x is less than approximately 0.15, or x is less than approximately 0.05, or x is less than approximately 0.03, or x is even less than approximately 0.01. In some embodiments, the doped metal oxide film, such as $M_{1-x}D_xO_2$, is a solid solution. In some embodiments, the doped metal oxide film, such as $M_{1-x}D_xO_2$, has crystal structure of the corresponding metal oxide, for example in case of silicon doped titanium oxide, the material has the crystal structure of $TiO_2$, such as anatase. In some embodiments, the doped metal oxide film is a solid solution and is in amorphous or substantially amorphous phase. In some embodiments, the doped metal oxide film comprises a nanocomposite film. In some embodiments, the doped metal oxide film comprises a laminate film.

Figure 2:
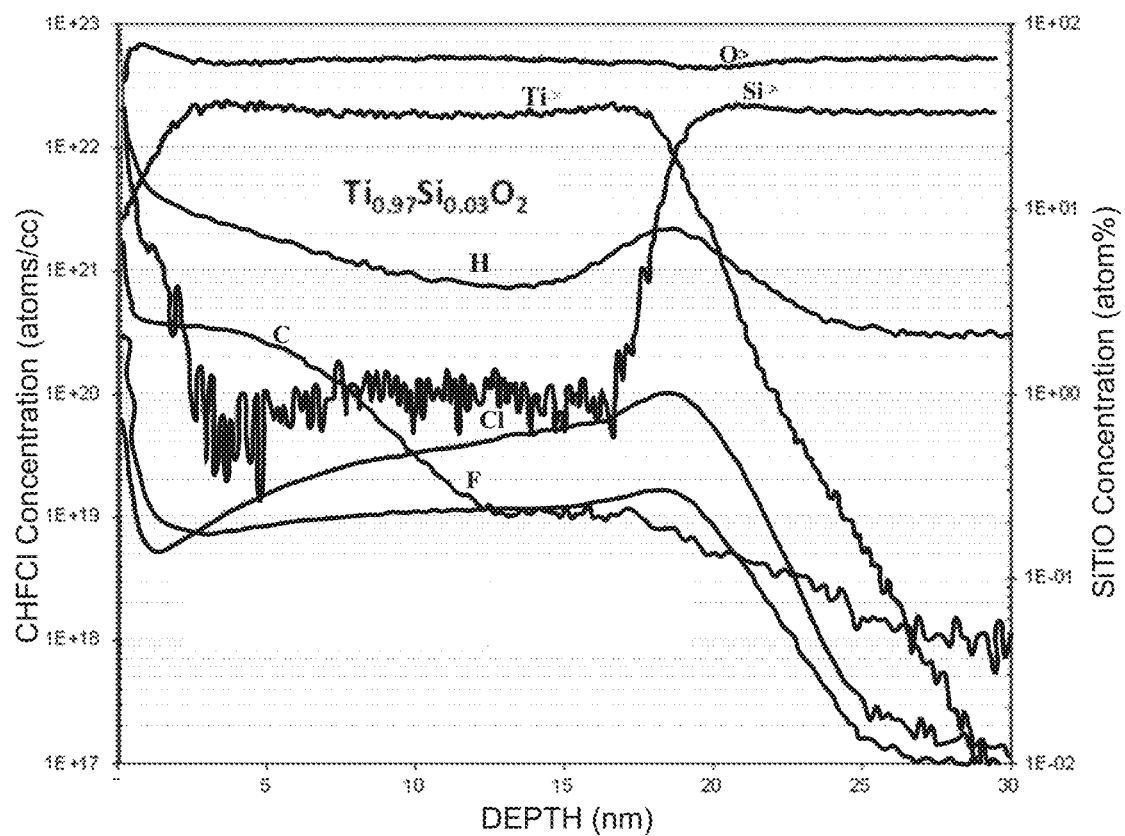
FIG. 2 is a graph showing a combined x-ray photoelectron spectroscopy (XPS) and secondary ion mass spectroscopy (SIMS) depth profile of a silicon doped titanium oxide film formed according to the embodiments of the disclosure.

As a non-limiting example embodiment FIG. 2 illustrates a graph showing a combination of a x-ray photoelectron spectroscopy (XPS) scan and a secondary ion mass spectrometry (SIMS) depth profile scan of an example doped metal oxide film formed by the ALD process of the current disclosure utilizing a first reactant, followed by a second reactant and a subsequent third reactant For example, the combined XPS and SIMS depth profile scan illustrated in FIG. 2 is taken from a silicon doped titanium oxide film formed by ALD utilizing titanium tetrachloride as a first reactant, followed by disilane as a second reactant and subsequently followed by water vapor as a third reactant at a substrate temperature of 350° C. The combination XPS and SIMS depth profile scan illustrated in FIG. 2 indicates that the example silicon doped titanium oxide film formed by the methods of the disclosure comprises $Ti_{0.97}Si_{0.03}O_2$.

In some alternative embodiments of the disclosure a deposition cycle may comprise alternatively and sequentially contacting the substrate with the first reactant, followed by the third reactant and subsequently followed by the second reactant. The deposition cycle in which the substrate is alternatively contacted with the first vapor phase reactant (i.e., the metal halide source), the third vapor phase reactant (i.e., the oxide source) and the second vapor phase reactant (i.e., the hydrogenated source) may be repeated two or more times until a desired thickness of a doped metal oxide film is deposited.

In embodiments wherein the doped metal oxide film is formed by alternative contacting the substrate with the first reactant, followed by the third reactant and subsequently by the second reactant, the doped metal oxide film may comprise an electrical insulator. In such embodiments the electrically insulating doped metal oxide film may have an electrical resistivity of greater than approximately 100 mΩ-cm, or greater than approximately 1000 mΩ-cm, or even greater than approximately 100000 mΩ-cm. In such embodiments the electrically insulating doped metal oxide film may have an electrical resistivity of greater than approximately 1 mΩ-cm at a film thickness of less than approximately 1000 nm, or less than approximately 100 nm, or even less than approximately 10 nm.

Figure 3:
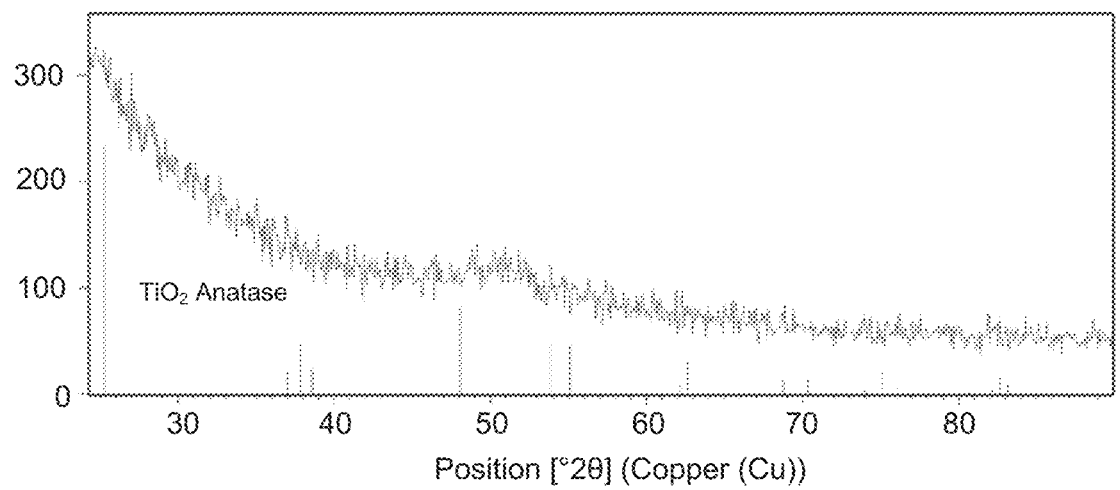
FIG. 3 is a graph showing a x-ray diffraction (XRD) scan of a silicon doped titanium oxide film formed according to the embodiments of the disclosure.

In embodiments wherein the doped metal oxide film is formed by alternative contacting the substrate with the first reactant, followed by the third reactant and subsequently by the second reactant, the doped metal oxide film may have a substantially amorphous structure. As a non-limiting example embodiment FIG. 3 illustrates a graph showing the 2 theta x-ray diffraction (XRD) scan of an example doped metal oxide film formed by an ALD process of the current disclosure utilizing a first reactant, followed by a third reactant and a subsequent second reactant For example, the XRD scan illustrated in FIG. 3 is taken from a silicon doped titanium oxide film formed by ALD utilizing titanium tetrachloride as a first reactant, followed by water vapor as a third reactant and subsequently followed by disilane as a second reactant at a substrate temperature of 350° C. The XRD scan illustrated in FIG. 3 indicates that the example silicon doped titanium oxide film formed by the methods of the disclosure is substantially amorphous, as indicated by the distinct lack of any discernable XRD peaks in the XRD scan illustrated in FIG. 3.

In embodiments wherein the doped metal oxide film is formed by alternative contacting the substrate with the first reactant, followed by the third reactant and subsequently by the second reactant the doped silicon oxide film may comprise at least one of silicon doped titanium oxide ($Ti_{1-x}Si_xO_2$), germanium doped titanium oxide ($Ti_{1-x}Ge_xO_2$), silicon doped zirconium oxide ($Zr_{1-x}Si_xO_2$), germanium doped zirconium oxide ($Zr_{1-x}Ge_xO_2$), silicon doped hafnium oxide ($Hf_{1-x}Si_xO_2$), or germanium doped hafnium oxide ($Hf_{1-x}Ge_xO_2$), where x is 0≤x≤1. In some embodiments of the disclosure the doped metal oxide film, may have a general formula given by $M_{1-x}D_xO_2$ where M is the metal, D is the dopant and wherein x is greater than approximately 0.05, or x is greater than approximately 0.10, or x is even greater than approximately 0.15.

Figure 4:
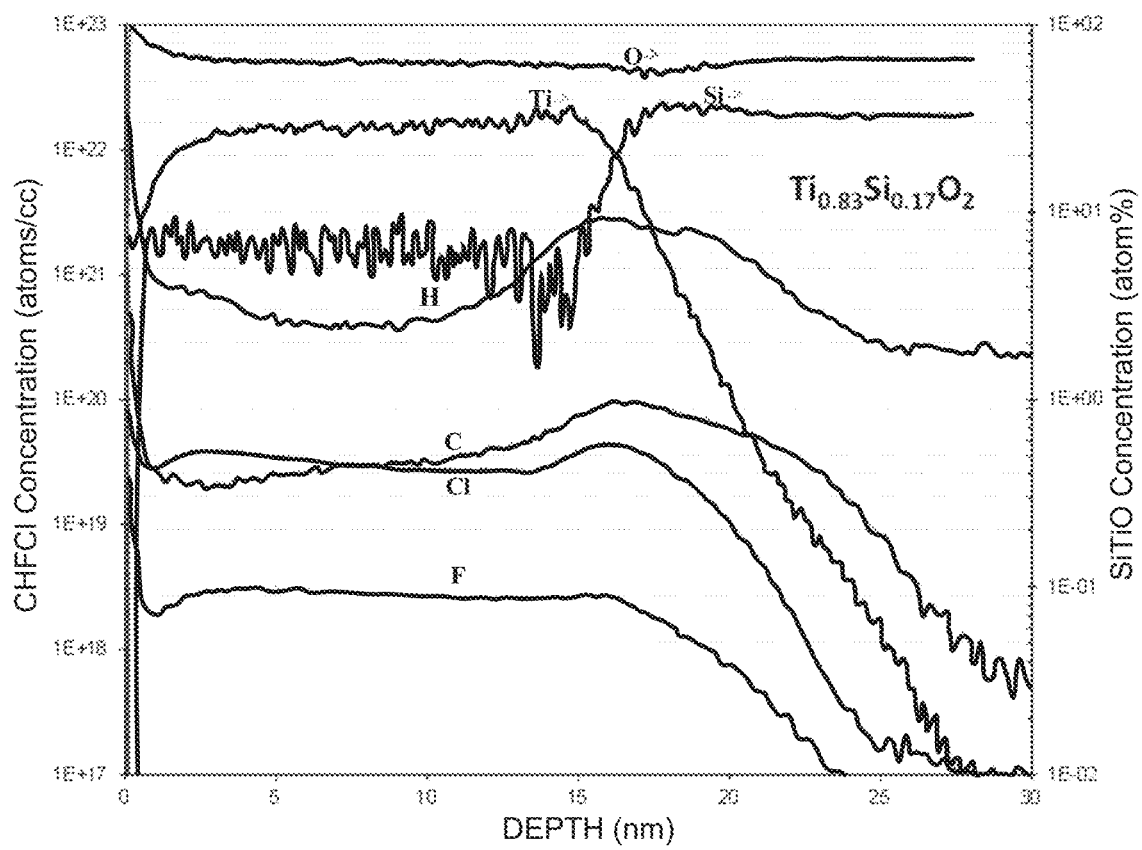
FIG. 4 is a graph showing a combined x-ray photoelectron spectroscopy (XPS) and second ion mass spectroscopy (SIMS) depth profile of a silicon doped titanium oxide film formed according to the embodiment of the disclosure.

As a non-limiting example embodiment FIG. 4 illustrates a graph showing a combination of a x-ray photoelectron spectroscopy (XPS) scan and a secondary ion mass spectrometry (SIMS) depth profile scan of an example doped metal oxide film formed by the ALD processes of the current disclosure utilizing a first reactant, followed by a third reactant and a subsequent second reactant For example, the XPS and SIMS depth profile scan illustrated in FIG. 4 is taken from a silicon doped titanium oxide film formed by ALD utilizing titanium tetrachloride as a first reactant, followed by water vapor as a second reactant and subsequently followed by disilane as a third reactant at a substrate temperature of 350° C. The XPS and SIMS depth profile scan illustrated in FIG. 4 indicates that the example silicon doped titanium oxide film formed by the methods of the disclosure comprises $Ti_{0.83}Si_{0.17}O_2$.

Thin films comprising a doped metal oxide film deposited according to some of the embodiments described herein may be continuous thin films. In some embodiments, the thin films comprising a doped metal oxide film deposited according to some of the embodiments described herein may be continuous at a thickness below about 100 nm, below about 60 nm, below about 50 nm, below about 40 nm, below about 30 nm, below about 25 nm, or below about 20 nm, or below about 15 nm, or below about 10 nm, or below about 5 nm, or lower. The continuity referred to herein can be physically continuity or electrical continuity. In some embodiments, the thickness at which a film may be physically continuous may not be the same as the thickness at which a film is electrically continuous, and the thickness at which a film may be electrically continuous may not be the same as the thickness at which a film is physically continuous.

While, in some embodiments, a thin film comprising a doped metal oxide film deposited according to some of the embodiments described herein may be continuous, In some embodiments, it may be desirable to form a non-continuous thin film comprising a doped metal oxide film, or a thin film comprising separate islands or nanoparticles comprising a doped metal oxide film. In some embodiments, the deposited thin film comprising a doped metal oxide film may comprise nanoparticles that are not substantially physically or electrically continuous with one another. In some embodiments, the deposited thin film comprising a doped metal oxide film may comprise separate nanoparticles, or separate islands, comprising a doped metal oxide film.

It should be appreciated that, in some embodiments, the cyclical deposition process may comprise contacting the substrate with the first vapor phase reactant one or more times prior to contacting the substrate with the second vapor phase reactant one or more times and subsequently contacting the substrate with the third vapor phase reactant one or more times and similarly may alternatively comprise contacting the substrate with the first vapor phase reactant one or more times prior to contacting the substrate with the third vapor phase reactant one or more times and subsequently contacting the substrate with the second vapor phase reactant one or more times.

In further embodiments of the disclosure, yet further alternative pulsing sequences comprising the first reactant, the second reactant and the third reactant may be utilized. In some embodiments of the disclosure, a previously applied pulse of reactant may be repeated within a single deposition cycle. For example, a deposition cycle may comprise contacting the substrate with the first reactant, followed by the second reactant, followed by repeating the first reactant subsequently followed by the third reactant. As a non-limiting example of such an embodiment, the substrate may be contacted with silicon tetrachloride, followed by disilane, followed by silicon tetrachloride, subsequently followed by wafer vapor. In such a non-limiting example, the doped metal oxide formed may comprise a silicon doped titanium oxide and may have a substantially crystalline structure as determined by XRD measurements. As a further non-limiting example, a deposition cycle may comprise contacting the substrate with the second reactant, followed by the first reactant, followed by repeating the second reactant and subsequently followed by the third reactant. As a non-limiting example of such an embodiment, the substrate may be contacted with disilane, followed by titanium tetrachloride, followed by disilane and subsequently followed by water vapor. In such a non-limiting example, the doped metal oxide formed may comprise a silicon doped titanium oxide and may comprise a substantially amorphous crystalline structure as determined by XRD measurements.

Additional embodiments of the disclosure may comprise selecting the first vapor phase reactant, the second vapor phase reactant and the third vapor phase reactant to comprise non-plasma reactants, e.g., the first, second and third vapor phase reactants are substantially free of ionized reactive species. In some embodiments, the first, second and third vapor phase reactants are substantially free of ionized reactive species, excited species or radical species. For example, the first vapor phase reactant, the second vapor phase reactant and the third vapor phase reactant may comprise non-plasma reactants to prevent ionization damage of the underlying substrate and the associated defects.

The cyclical deposition processes described herein, utilizing a metal halide source, a hydrogenated source and an oxide source to form a doped metal oxide film, may be performed in an ALD or CVD deposition system with a heated substrate. For example, in some embodiments, methods may comprise heating the substrate to temperature of between approximately 80° C. and approximately 140° C., or even heating the substrate to a temperature of between approximately 80° C. and approximately 120° C. Of course, the appropriate temperature window for any given cyclical deposition process, such as, for an ALD reaction, will depend upon the surface termination and reactant species involved. Here, the temperature varies depending on the precursors being used and is generally at or below about 1000° C., or below about 750° C. In some embodiments, the deposition temperature is generally at or above about 100° C. for vapor deposition processes. In some embodiments, the deposition temperature is between about 100° C. and about 250° C., and, in some embodiments, the deposition temperature is between about 120° C. and about 200° C. In some embodiments, the deposition temperature is below about 500° C., below about 400° C., or below about 300° C. In some embodiments, the deposition temperature can be below about 200° C., or below about 150° C., or below about 100° C., for example, if additional reactants or reducing agents, such as ones reactants or reducing agents comprising hydrogen, are used in the process. In some instances the deposition temperature can be above about 20° C., or above about 50° C., or above about 75° C. In some embodiments, the deposition temperature can be from about 20° C. to about 1000° C., or from about 50° C. to about 600° C., or from about 100° C. to about 500° C.

In some embodiments, the growth rate of the doped metal oxide film is from about 0.005 Å/cycle to about 5 Å/cycle, or from about 0.01 Å/cycle to about 2.0 Å/cycle. In some embodiments, the growth rate of the film is more than about 0.05 Å/cycle, or more than about 0.1 Å/cycle, or more than about 0.15 Å/cycle, or more than about 0.20 Å/cycle, or more than about 0.25 Å/cycle, or even more than about 0.3 Å/cycle. In some embodiments, the growth rate of the film is less than about 2.0 Å/cycle, or less than about 1.0 Å/cycle, or less than about 0.75 Å/cycle, or less than about 0.5 Å/cycle, or even less than about 0.3 Å/cycle. In some embodiments of the disclosure the growth rate of the doped metal oxide film may be approximately 0.5 Å/cycle.

In some embodiments, a thin film comprising a doped metal oxide may comprise less than about 20 at-%, or less than about 10 at-%, or less than about 7 at-%, or less than about 5 at-%, or less than about 3 at-%, or less than about 2 at-%, or less than about 1 at-% of impurities, that is, elements other than the desired doped metal oxide film. In some embodiments, the thin film comprising a doped metal oxide may comprise less than about 20 at-%, or less than about 10 at-%, or less than about 5 at-%, or less than about 2 at-%, or less than about 1 at-% of hydrogen. In some embodiments, the thin film comprising a doped metal oxide may comprise less than about 10 at-%, or less than about 5 at-%, or less than about 2 at-%, or less than about 1 at-%, or less than about 0.5 at-% of carbon. In some embodiments, the thin film comprising a doped metal oxide may comprise less than about 5 at-%, or less than about 2 at-%, or less than about 1 at-%, or less than about 0.5 at-%, or less than about 0.2 at-% of nitrogen. In some embodiments, the thin film comprising a doped metal oxide may comprise less than about 75 at-%, or less than about 70 at-%, or less than about 68 at-%, or more than about 40 at-%, or more than about 50 at-%, or more than about 60 at-%, or more than about 64% of oxygen. In some embodiments, the doped metal oxide film may comprises from about 40 at-% to about 80 at-%, or from about 55 at-% to about 75 at-%, or from about 60 at-% to about 72% of oxygen, or from about 66 to about 67% of oxygen. In some embodiments, the doped metal oxide film may comprise the dopant (Si or Ge) from about 0 at-% to about 40 at-%, or from about 1 at-% to about 25 at-%, or from about 2 at-% to about 15%, or from about 5 at-% to about 15% of silicon or germanium. In some embodiments, the doped metal oxide film may comprise from the dopant (Si or Ge) more than about 1 at-%, or more than about 2 at-%, or more than about 5 at-%, or more than about 8 at-%, or more than about 10 at-%, or more than about 15 at-% of silicon or germanium. In some embodiments, the doped metal oxide film may comprises from the said metal from about 20 at-% to about 75 at-%, or from about 30 at-% to about 70 at-%, or from about 40 at-% to about 67%, or from about 50 at-% to about 65% of the said metal. In some embodiments, the doped metal oxide film may comprises from the said metal more than about 20 at-%, or more than about 30 at-%, or more than about 40 at-%, or more than about 50 at-%, or more than about 55 at-%, or more than about 60 at-% of the said metal (titanium, hafnium or zirconium, and in particular embodiments titanium).

In some embodiments, the doped metal oxide films may be deposited on three-dimensional structures. In some embodiments, the step coverage of the doped metal oxide film may be equal to or greater than about 50%, or greater than about 80%, or greater than about 90%, or about 95%, or about 98%, or about 99%, or greater in structures having aspect ratios (height/width) of more than about 2, or more than about 5, or more than about 10, or more than about 25, or more than about 50, or more than about 100.

In some embodiments, the doped metal oxide films has a RMS (root mean square) roughness, for example as measured by AFM (atomic force microscopy), of less than approximately 10 nm, or less than approximately 5 nm, or less than approximately 2 nm, or less than approximately 1 nm, or less than approximately 0.5 nm, or less than approximately 0.35 nm, or less than approximately 0.3 nm, or less than approximately 0.25 nm, or even less than approximately 0.2 nm.

In some embodiments, the doped metal oxide film etch rate, such as the wet etch rate (WER) or the dry etch rate (DER), and the selectivity to other materials can be tuned by tuning the film properties by, for example, changing the pulsing order in a desired manner. In some embodiments, the doped metal oxide film may have etch selectivity towards pure metal oxide films or other metal oxide films. In other embodiments the doped metal oxide film has etch selectivity towards pure silicon dioxide films. In yet other embodiments the doped metal oxide film may have etch selectivity towards other film types, such as silicon nitrides, or carbides, or mixtures thereof, metal nitrides, or carbides, or mixtures thereof. In some embodiments, the etch rate of the doped metal oxide film is more or less than pure metal oxide film. In some embodiments, the etch rate of the doped metal oxide films is more or less than the pure silicon dioxide film. In some embodiments, at least two or more different doped metal oxide films having substantially different etch rates (and corresponding etch selectivity) are deposited, for example in a process flow comprising multiple patterning, by changing the pulsing order and/or pulsing ratio in desired manner.

In some embodiments, the doped metal oxide film has tunable optical properties, such as refractive index (n) and/or extinction coefficient (k). In some embodiments, n is less than approximately 1.7, or n is less than approximately 1.9, or n is less than approximately 2.1, or n is less than approximately 2.3, or n is less than approximately 2.5. In some embodiments, n is more than approximately 1.9, or n is more than approximately 2.0, or n is more than approximately 2.1, or n is more than approximately 2.2, or n is more than approximately 2.3. In some embodiments, at least two or more optically different doped metal oxide films are deposited, for example in a process flow comprising multiple patterning, by changing the pulsing order and/or pulsing ratio in desired manner.

In some embodiments, the deposited doped metal oxide film may be subjected to a treatment process after deposition. In some embodiments, this treatment process may, for example, enhance the conductivity or continuity of the deposited film comprising a doped metal oxide. In some embodiments, a treatment process may comprise, for example an anneal process. In some embodiments, the film comprising a doped metal oxide may be annealed in an atmosphere comprising vacuum or one or more annealing gases, for example a reducing gas such as reducing gas comprising hydrogen.

The doped metal oxide films formed by the cyclical deposition processes disclosed herein can be utilized in a variety of contexts, such as in the formation of semiconductor device structures.

Figure 5A:
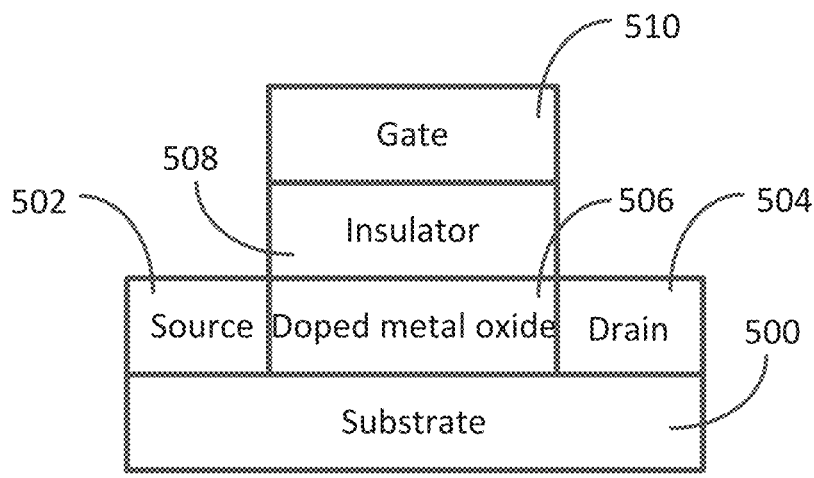
FIGS. 5A-5C are simplified cross section views of semiconductor device structures including a doped metal oxide film formed according to the embodiments of the disclosure.

One of skill in the art will recognize that the processes described herein are applicable to many contexts, including fabrication of diodes including light emitting diodes and transistors including planar devices as well as multiple gate transistors, such as FinFETs. As a non-limiting example, a transistor structure may comprise a channel material comprising a doped metal oxide (e.g., $Ti_{1-x}Si_xO_2$). In greater detail and with reference to FIG. 5A, a semiconductor device structure may comprise a transistor structure and may further comprise a substrate 500, a source region 502, and a drain region 504 with a conductive doped metal oxide 506, formed by the methods of the disclosure, disposed between the source region 502 and the drain region 504. The example transistor structure may also comprise an insulator 508 disposed above the conductive doped metal oxide layer 506 and in addition a gate structure 510 disposed above the insulator 508.

Figure 5B:
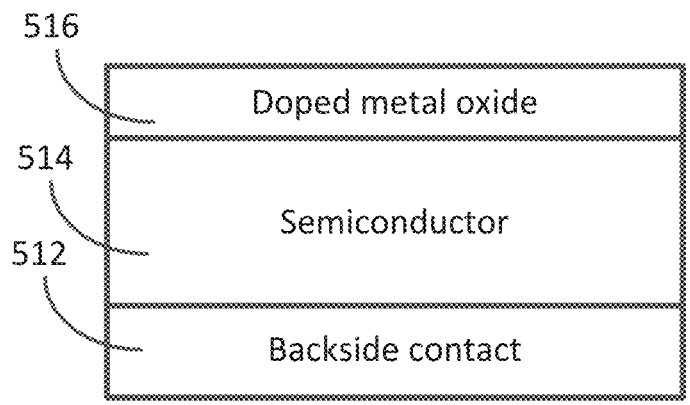

As a further non-limiting example, a device structure may comprise a solar cell device wherein the solar cell device comprises a transparent conductive oxide comprising a doped metal oxide (e.g., $Ti_{1-x}Si_xO_2$). In greater detail, and with reference to FIG. 5B, a semiconductor device structure may comprise a solar cell structure and may further comprise a backside contact 512 in contact with a semiconductor 514. The solar cell structure of FIG. 5B may also comprise a conductive doped metal oxide 516 disposed above the semiconductor 514, the conductive doped metal oxide 516 being formed by the methods of the disclosure.

Figure 5C:
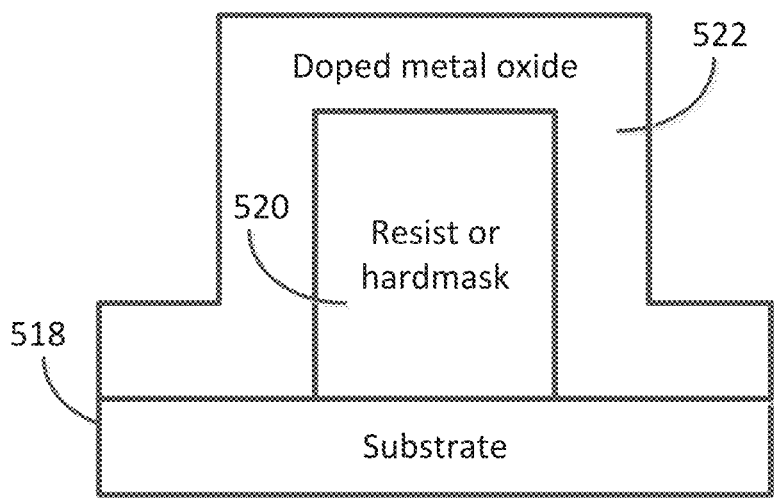

In further embodiments of the disclosure, the doped metal oxide films of the current disclosure may be utilized as useful layers in the fabrication of semiconductor device structures. As non-limiting example embodiments, the doped metal oxide films of the current disclosure may be utilized as sacrificial films, or hard masks for applications related to multiple patterning applications, such as, for example, double or quadruple patterning applications. For example, the embodiments of the disclosure may allow for the formation of doped metal oxide films with adjustable (i.e., tunable) properties, including, but not limited to, optical properties, roughness, electrical resistivity, crystallinity and etch rate. Therefore, the doped metal oxide films formed by the methods of the current disclosure may be suitable for lithography/patterning related applications, such as, for example, multiple patterning applications. Therefore, some embodiments of the disclosure may comprise a partially fabricated device structure comprising a masking structure configured for subsequent patterning of an underlying layer, the masking structure comprising a doped metal oxide formed by the methods of the current disclosure. In greater detail and with reference to FIG. 5C a partially fabricated device structure as illustrated in FIG. 5C may comprise a substrate 518. Disposed over the substrate 518 may be a resist or hard-mask 520, formed by photolithography methods. Disposed over the resist or hard-mask 522 may be a doped metal oxide formed by the methods of the disclosure.

In some embodiments of the disclosure, a device structure may comprise one or more alternating layers of doped metal oxide wherein the doped metal oxide film formed may comprise alternating layers of doped metal oxide with differing electrical and structural properties. As a non-limiting example embodiment, the methods of the disclosure may form a doped metal oxide structure comprising alternating layers of substantially crystalline doped metal oxide and substantially amorphous doped metal oxide. In additional embodiments of the disclosure, methods may comprise forming a doped metal oxide structure comprising alternating layers of doped metal oxides comprising differing electrical conductivities.

Figure 6:
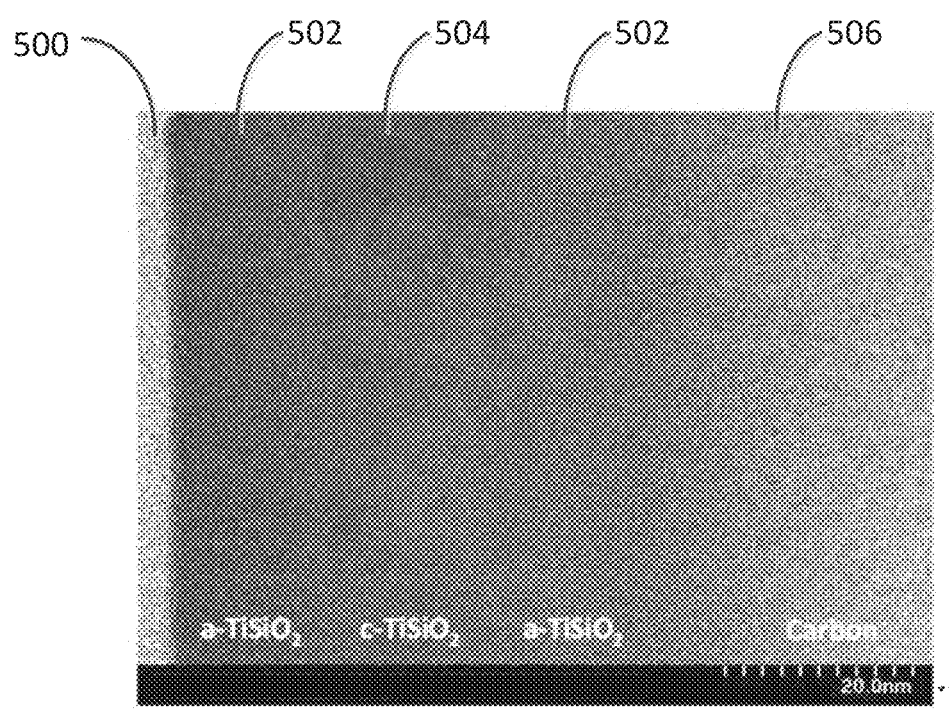
FIG. 6 is a scanning transmission electron microscopy (STEM) image of a nanolaminate structure comprising alternating layers of substantially crystalline silicon doped titanium oxide and substantially amorphous silicon doped titanium oxide.

FIG. 6 illustrates a non-limiting example embodiment of the current disclosure which shows an aberration corrected scanning transmission electron microscopy (STEM) image of a nanolaminate structure comprising alternating layers of substantially crystalline silicon doped titanium oxide and substantially amorphous silicon doped titanium oxide. In some embodiments, the doped metal oxide film is transparent or substantially transparent to visible light. In some embodiments, the doped metal oxide film is crystalline and is electrically conductive. In some embodiments, the doped metal oxide film is substantially amorphous, for example as characterized by XRD, and is insulating. In some embodiments, the doped metal oxide films electrical and optical properties can be tuned.

In greater detail, FIG. 6 illustrates a substrate 500 comprising silicon dioxide ($SiO_2$), substantially amorphous silicon doped titanium oxide layers 502 and substantially crystalline silicon doped titanium oxide layer 504. The layer denoted as 506 comprises a layer of carbon utilized as part of the measurement technique. The substantially amorphous silicon doped titanium oxide layers 502 are formed by alternately and sequentially contacting the substrate with titanium tetrachloride, followed by water, followed subsequently by disilane, whereas the substantially crystalline silicon doped titanium oxide layer 504 is formed by alternately and sequentially contacting the substrate with titanium tetrachloride, followed by disilane, followed subsequently by water vapor. As a non-limiting example embodiment of the disclosure, a nanolaminate structure as described herein, comprising alternating layer of substantially crystalline and substantially amorphous layers of doped metal oxides (e.g., $Ti_{1-x}Si_xO_2$) may comprise the channel region in a transistor device structure.

Figure 7:
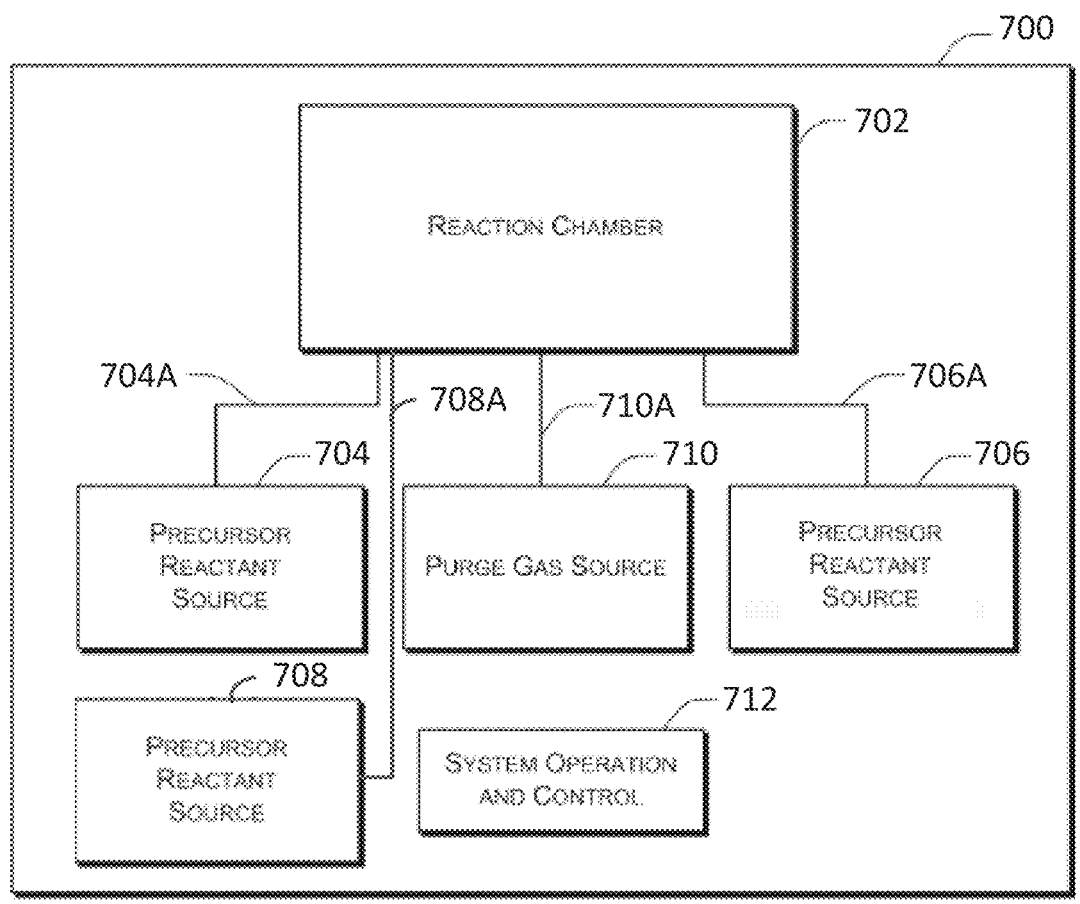
FIG. 7 illustrates a reaction system configured to perform certain embodiments of the disclosure.

Embodiments of the disclosure may also include a reaction system configured for forming the doped metal oxide films of the present disclosure. In more detail, FIG. 7 schematically illustrates a reaction system 700 including a reaction chamber 702 that further includes mechanism for retaining a substrate (not shown) under predetermined pressure, temperature, and ambient conditions, and for selectively exposing the substrate to various gases. A precursor reactant source 704 may be coupled by conduits or other appropriate means 704A to the reaction chamber 702, and may further couple to a manifold, valve control system, mass flow control system, or mechanism to control a gaseous precursor originating from the precursor reactant source 704. A precursor (not shown) supplied by the precursor reactant source 704 may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 702 through conduit 704A. In other embodiments, the precursor may be a vapor under standard conditions. In such embodiments, the precursor does not need to be vaporized and may not require a carrier gas. For example, in one embodiment the precursor may be stored in a gas cylinder. The reaction system 700 may also include additional precursor reactant sources, such as precursor reactant sources 706 and 708 which may also be couple to the reaction chamber by conduits 706A and 708A as described above.

A purge gas source 710 may also be coupled to the reaction chamber 702 via conduits 710A, and selectively supplies various inert or noble gases to the reaction chamber 702 to assist with the removal of precursor gas or waste gasses from the reaction chamber. The various inert or noble gasses that may be supplied may originate from a solid, liquid or stored gaseous form.

The reaction system 700 of FIG. 7, may also comprise a system operation and control mechanism 712 that provides electronic circuitry and mechanical components to selectively operate valves, manifolds, pumps and other equipment included in the reaction system 700. Such circuitry and components operate to introduce precursors, purge gasses from the respective precursor sources 704, 706, 708, and purge gas source 710. The system operation and control mechanism 712 also controls timing of gas pulse sequences, temperature of the substrate and reaction chamber, and pressure of the reaction chamber and various other operations necessary to provide proper operation of the reaction system 700. The operation and control mechanism 712 can include control software and electrically or pneumatically controlled valves to control flow of precursors, reactants and purge gasses into and out of the reaction chamber 702. The control system can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present reaction system are possible, including different number and kind of precursor reactant sources and purge gas sources. Further, such persons will also appreciate that there are many arrangements of valves, conduits, precursor sources, purge gas sources that may be used to accomplish the goal of selectively feeding gasses into reaction chamber 702. Further, as a schematic representation of a reaction system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for forming a doped metal oxide film on a substrate, comprising:
   contacting the substrate with a first reactant comprising a metal halide source;
   contacting the substrate with a second reactant comprising a hydrogenated source, wherein the hydrogenated source is a dopant precursor for the doped metal oxide film; and
   contacting the substrate with a third reactant comprising an oxide source,
   wherein the doped metal oxide film comprises a structure depending on an order of the contacting the substrate with the first reactant, the contacting the substrate with the second reactant, and the contacting the substrate with the third reactant,
   wherein the metal halide source comprises at least one transition metal selected from the group consisting of scandium (Sc), yttrium (Y), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg), and
   wherein the structure of the doped metal oxide film comprises a substantially amorphous structure in response to the contacting the substrate with the third reactant occurring after the contacting the substrate with the first reactant and before the contacting the substrate with the second reactant.

2. The method of claim 1, wherein the substrate is heated to a temperature between about 120° C. and about 200° C.

3. The method of claim 1, wherein the doped metal oxide film comprises between 2 atomic percent and 15 atomic percent dopant.

4. The method of claim 1, wherein the hydrogenated source comprises a hydrogenated silicon source, which comprises at least one of silane ($SiH_4$), disilane ($Si_2H_6$), trisilane ($Si_3H_8$), or tetrasilane ($Si_4H_{10}$).

5. The method of claim 1, wherein the oxide source comprises at least one of ozone ($O_3$), an oxygen (O) radical, atomic oxygen (O), molecular oxygen ($O_2$), an oxygen plasma, or hydrogen peroxide ($H_2O_2$).

6. The method of claim 1, wherein the method comprises a deposition cycle, the deposition cycle comprising the contacting the substrate with the first reactant, the contacting the substrate with the third reactant, and the contacting the substrate with the second reactant, and wherein the deposition cycle is repeated two or more times.

7. The method of claim 1, wherein the doped metal oxide film comprises greater than 15 atomic percent dopant.

8. The method of claim 1, further comprising a step of purging the first reactant and first reaction byproducts.

9. The method of claim 1, wherein the hydrogenated source is selected from the group consisting of a silane, having a formula $Si_xH_{(2x+2)}$ or a cyclic silane, and a germane, having a formula $Ge_xH_{(2x+2)}$ or a cyclic germane, wherein the hydrogenated source is a dopant precursor for the doped metal oxide film.

10. The method of claim 1, further comprising repeating contacting the substrate with the first reactant subsequently followed by contacting the substrate with the third reactant.

11. The method of claim 1, wherein the hydrogenated source is selected from the group consisting of cyclic silane and cyclic germane.

12. The method of claim 1, wherein the second reactant comprises a reducing agent comprising hydrogen, and wherein a deposition temperature is less than 150° C.

13. The method of claim 12, wherein the deposition temperature is less than 100° C.

14. The method of claim 1, wherein the doped metal oxide film has an electrical resistivity greater than about 1000 mΩ-cm.

15. A method for forming a doped metal oxide film on a substrate, comprising:
   contacting the substrate with a first reactant comprising a metal halide source;
   contacting the substrate with a second reactant comprising a hydrogenated source, wherein the hydrogenated source is a dopant precursor for the doped metal oxide film, wherein the hydrogenated source comprises a hydrogenated germanium source, which comprises at least one of germane ($GeH_4$), digermane ($Ge_2H_6$), trigermane ($Ge_3H_8$), or tetragermane ($Ge_4H_{10}$); and
   contacting the substrate with a third reactant comprising an oxide source,
   wherein the doped metal oxide film comprises a structure depending on an order of the contacting the substrate with the first reactant, the contacting the substrate with the second reactant, and the contacting the substrate with the third reactant,
   wherein the metal halide source comprises at least one transition metal selected from the group consisting of scandium (Sc), yttrium (Y), titanium (Ti), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg), and
   wherein the structure of the doped metal oxide film comprises a substantially amorphous structure in response to the contacting the substrate with the third reactant occurring after the contacting the substrate with the first reactant and before the contacting the substrate with the second reactant.

16. The method of claim 15, wherein the metal halide source comprises titanium tetrachloride ($TiCl_4$).

17. The method of claim 15, wherein the metal halide source comprises titanium.

18. The method of claim 17, wherein the hydrogenated source comprises a hydrogenated germanium source, which comprises at least one of digermane ($Ge_2H_6$), trigermane ($Ge_3H_8$), or tetragermane ($Ge_4H_{10}$).

19. A method for forming a doped metal oxide film on a substrate, comprising:
   contacting the substrate with a first reactant comprising a metal halide source, wherein the metal halide source comprises at least one transition metal selected from the group consisting of scandium (Sc), yttrium (Y), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), and mercury (Hg);

contacting the substrate with a second reactant comprising a hydrogenated source, wherein the hydrogenated source is a dopant precursor for the doped metal oxide film; and contacting the substrate with a third reactant comprising an oxide source, wherein the doped metal oxide film comprises a structure depending on an order of the contacting the substrate with the first reactant, the contacting the substrate with the second reactant, and the contacting the substrate with the third reactant, wherein the structure of the doped metal oxide film comprises a substantially amorphous structure in response to the contacting the substrate with the third reactant occurring after the contacting the substrate with the first reactant and before the contacting the substrate with the second reactant, and wherein the second reactant comprises a reducing agent, and wherein the step of contacting the substrate with a second reactant forms a metallic film.

* * * * *